(12) United States Patent
Moncayo et al.

(10) Patent No.: US 9,433,083 B2
(45) Date of Patent: Aug. 30, 2016

(54) EDGE MOUNT CONNECTOR ARRANGEMENT WITH IMPROVED CHARACTERISTIC IMPEDANCE

(71) Applicant: Mindspeed Technologies, Inc., Newport Beach, CA (US)

(72) Inventors: Alfredo Moncayo, Newport Beach, CA (US); Brian Hostetter, Newport Beach, CA (US); Luis F. Armenta, Newport Beach, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 14/679,892

(22) Filed: Apr. 6, 2015

(65) Prior Publication Data

US 2015/0288085 A1 Oct. 8, 2015

Related U.S. Application Data

(60) Provisional application No. 61/975,676, filed on Apr. 4, 2014.

(51) Int. Cl.

| | |
|---|---|
| H01R 12/00 | (2006.01) |
| H05K 1/02 | (2006.01) |
| H05K 1/11 | (2006.01) |
| H01R 24/50 | (2011.01) |

(52) U.S. Cl.
CPC .............. *H05K 1/025* (2013.01); *H01R 24/50* (2013.01); *H05K 1/115* (2013.01); *H05K 2201/0195* (2013.01); *H05K 2201/10015* (2013.01); *H05K 2201/10189* (2013.01)

(58) Field of Classification Search
USPC .......................... 439/63, 581, 80; 333/33, 260
See application file for complete search history.

(56) References Cited

U.S. PATENT DOCUMENTS

| | | |
|---|---|---|
| 5,173,766 A | 12/1992 | Long et al. |
| 5,302,022 A | 4/1994 | Huang et al. |
| 5,411,918 A | 5/1995 | Keible et al. |
| 5,525,546 A | 6/1996 | Harada et al. |

(Continued)

FOREIGN PATENT DOCUMENTS

GB    2 292 279    2/1996

OTHER PUBLICATIONS

FlipChips Dot Com "Tutorial 2—Solder Bump Flip chip", http://www.flipchips.com/tutorial102a.html, 7pages.

(Continued)

*Primary Examiner* — Xuong Chung Trans
(74) *Attorney, Agent, or Firm* — Weide & Miller, Ltd.

(57) ABSTRACT

An electrical interface on a circuit board is disclosed for electrically connecting the circuit board to a connector to reduce reflections and impedance mismatch and increase power transfer from the connector to the signal path of the circuit board. The signal interface includes a signal conductor including a signal pad configured to connect to a connector pin and a waveguide section extending from the signal pad. The waveguide narrows from a signal pad width to connect to a microstrip conductor. A first ground section is spaced rightward from the signal conductor such that the inner edge of the first ground section, angles in correspondence with the narrowing of the waveguide to generally track an outer right edge of the waveguide. A second ground section is spaced leftward from the signal conductor and configured generally similarly to the first ground section.

21 Claims, 12 Drawing Sheets

(56) References Cited

U.S. PATENT DOCUMENTS

| | | | |
|---|---|---|---|
| 5,576,756 A | 11/1996 | Baty et al. | |
| 5,675,179 A | 10/1997 | Shu et al. | |
| 5,717,252 A | 2/1998 | Nakashima et al. | |
| 5,738,525 A | 4/1998 | Davies | |
| 6,040,984 A | 3/2000 | Hirakawa | |
| 6,109,508 A | 8/2000 | Orcutt | |
| 6,365,966 B1 | 4/2002 | Chen et al. | |
| 6,489,850 B2 | 12/2002 | Heineke et al. | |
| 6,575,762 B2 * | 6/2003 | Evans | H01R 9/0515 439/63 |
| 6,809,613 B2 | 10/2004 | Djordjevic et al. | |
| 6,831,352 B1 | 12/2004 | Tsai | |
| 6,954,082 B2 | 10/2005 | Grilletlc | |
| 7,042,318 B2 * | 5/2006 | Barnes | H01P 5/085 333/260 |
| 7,089,171 B2 | 8/2006 | Gravrok | |
| 7,124,388 B2 | 10/2006 | Wang | |
| 7,166,877 B2 * | 1/2007 | Greeley | H01L 23/66 257/259 |
| 7,443,272 B2 * | 10/2008 | Jiang | H01P 5/085 333/260 |
| 7,478,029 B1 | 1/2009 | Joffe | |
| 7,498,523 B2 * | 3/2009 | Miller | H01R 9/00515 174/261 |
| 7,501,709 B1 | 3/2009 | Hool et al. | |
| 8,154,362 B2 | 4/2012 | Allen | |
| 2005/0073038 A1 | 4/2005 | Kuo et al. | |
| 2010/0246413 A1 | 9/2010 | Schley-May et al. | |

OTHER PUBLICATIONS

"Highly Accelerated Stress Test (HAST)", © 1991-2001 Innovative Circuits Engineering, Inc., 1 page.

"HAST (Highly Accelerated Stress Testing", © 2003 Environ Laboratories, Inc., 2 pages.

"What is HAST?—Introduction", © 2003, ESPEC North America, Inc., 2 pages.

"What is HAST?—Principles of High Humidity", © 2003, ESPEC North America, Inc., 3 pages.

"What is HAST?—Test Equipment", © 2003, ESPEC North America, Inc., 6 pages.

"What is HAST?—Testing Techniques", © 2003, ESPEC North America, Inc., 4 pages.

"What is HAST?—Reliability Analysis", © 2003, ESPEC North America, Inc., 2 pages.

Backplane Connector Products—Molex, http://www.molex.com/molex/products/group?key=backplane_products&channel=PROD, 10 pages.

Insertion loss—Wikipedia, the free encyclopedia, http://en.wikipedia.org/wiki/Insertion—loss, 2 pages.

"Return Loss", EXFIBER © 2012 Exfiber Optial Technologies Co., Ltd, 2 pages.

* cited by examiner

EDGE MOUNT CONNECTOR ARRANGEMENT WITH IMPROVED CHARACTERISTIC IMPEDANCE

PRIORITY CLAIM

This application claims priority to and the benefit of U.S. Provisional Patent Application No. 61/975,676 filed on Apr. 4, 2014 and entitled Edge Mount Connector Arrangement with Improved Characteristic Impedance. The content of U.S. Provisional Patent Application No. 61/975,676 is incorporated by reference in its entirety.

FIELD OF THE INVENTION

This invention relates to board located cable connector interfaces and in particular to a connector arrangement with improved impedance matching.

RELATED ART

Video technology relies on industry standard specifications derived by the Society of Motion Picture and Television Engineers (SMPTE). A particular branch of the SMPTE standards defines Serial Digital Interface (SDI). SDI is a digital video interface that was first standardized in 1989, to transport broadcast-grade video between locations. Broadcast-grade video encompasses a vast range of signal types and products that are used to record, process, store and broadcast video.

With the advent of High Definition Television (HDTV), the SDI standard required higher operating data rates to be achieved on legacy infrastructure. For example, broadcast-grade video (simply referred to as video henceforth) relies on very long lengths of low-loss 75 ohm coaxial cable. With common installations having tens to hundreds of meters of cable between SDI transmitters and receivers, even low-loss cables produce tremendous losses. On top of this, the standard connector used to mate the cables to the printed circuit boards (PCB) is the Bayonet Neill-Concelman (BNC). The BNC connector was originally developed for military use and was designed during the 1940s. To this day, the connector remains unchanged and it is the standard connector defined for SDI even at 12 Gbps.

In numerous other signal processing application, communication and data exchange between electronic devices requires that a signal be passed through a cable or conductor. The ends of the cable are typically terminated with a connector.

The BNC (Bayonet Neill-Concelman) connector, discussed above, is a quick connect/disconnect radio frequency connector used for coaxial cable. It features two bayonet lugs on the female connector and a center pin. BNC connectors are used with miniature-to-subminiature coaxial cable in radio, television, and other radio-frequency electronic equipment, test instruments, video signals. Although discussed in relation to a BNC connector, it is contemplated that any type connector may suffer from similar drawbacks.

Actual devices and technology using BNC edge mount connectors suffer from being unable to operate at high frequencies. High frequency operation yields increased bit error rates due to an inability to accurately detect and decode received signals. For example, exchange of signals through BNC connectors at 12 Gbps is not possible in prior art systems.

One proposed prior art solution is presented in a public white paper written by Tsun-kit Chin. This paper describes a way to avoid impedance mismatches, reflections, and signal loss produced when BNC connectors are mounted on printed circuit boards. Tsun-solution proposes a clearance in the ground plane underneath connector's pin in order to reduce capacitance. However, this does not fully maintain a 75 ohm characteristic impedance and thus operation at higher frequencies relying only on the Tsun-kit solution is still not possible.

As a result, there exist drawbacks in the prior art which are not fully addressed. The method and apparatus described below overcomes these prior art drawbacks and provides additional benefits.

SUMMARY

To overcome the drawbacks of the prior art and provide additional benefits, an interface including a Bayonet Neill-Concelman (BNC) connector and a printed circuit board (PCB) comprising a BNC connector including a connector signal pin and an outer ground terminal on each side of the connector signal pin is innovated. In one embodiment, the connector signal pin is generally centered in relation to the ground terminal. A PCB is provided that has an edge configured to receive the BNC connector. The PCB has multiple layers and the layers form all or only a portion of the entire area of the PCB. The PCB layers include a first insulating support layer, a ground layer above the insulating support layer, a second insulating layer above the ground layer, and an interface layer on the second insulating layer such that the interface layer is configured to electrically connect the PCB to the BNC connector. The interface layer includes a signal path comprising a signal pad electrically connected to the connector signal pin. The signal pad has a signal pad width that is greater than the width of the connector signal pin. Also part of the signal path is a waveguide section and a microstrip trace. The waveguide section electrically connects to the signal pad such that the waveguide section is formed at a first end with the signal pad width and then tapering to a second end having a second width. The microstrip trace electrically connects to the tapered second end of the waveguide section, the waveguide section has a width generally equal to the second width. Also part of this embodiment is a ground path electrically connected to the connector ground terminal. The ground path is formed on each side of the signal path and includes conductive vias that pass through the second insulating layer to electrically connect the ground path to the ground layer in the PCB.

In one embodiment, the signal pad extends under the entire distance of the connector signal pin. It is contemplated that the waveguide section may be a coplanar waveguide. In one embodiment, the ground path has an inner edge that is spaced away from an opposing the edge of the signal pad and waveguide section by a constant distance to thereby correspond to the shape of the signal pad and waveguide section. It is also contemplated that the ground path has a first wing and a second wing located on opposing sides of the microstrip trace and the wings run parallel with the microstrip trace. A capacitor may be in series in the microstrip trace, the capacitor configured as a AC-coupling capacitor or DC block. In one configuration the ground path and signal pad is spaced at least 10 mils away from the edge of the PCB.

Also disclosed is a circuit board that is configured to electrically connect to a connector. The connector includes one or more connector ground terminals and one or more signal pins. The circuit board has a first edge and an opposing second edge. The first edge is configured to support the connector and electrically connect to the connector. The circuit board is configured with an electrically conductive ground area and an electrically conductive signal area.

The signal area is configured to include, from the first edge toward the second edge, a signal pad, a waveguide section, and a microstrip trace. The signal pad is electrically connected to at least one of the connector signal pins and has a first width. The waveguide section extends from the signal pad and it narrows in width from the first width to a second width. The microstrip trace has a second width and it extends from the waveguide section that is at the second width.

The ground area electrically connects to at least one of the connector ground terminals and the ground area includes a first wing to the right of the signal area and a second wing to the left of the signal area such that both of the first wing and second wing have an edge that opposes the signal area and which corresponds in profile to an edge of the signal area.

In one embodiment, the interface further comprises one or more vias on the right wing of the ground area and one or more vias on the left wing of the ground area and the vias are lined, filled with, or formed of conductive material to electrically connect the ground area to a ground layer in the circuit board. In other embodiments, a greater number of vias may be located on each ground area and the placement of the vias is discussed below. The interface may further comprise a capacitor in series with the microstrip trace. In one configuration, the circuit board further includes a first insulating support layer, a ground layer above the insulating support layer, a second insulating layer above the ground layer such that the second insulating layer supports the signal area and the ground area.

The signal area and the ground area may be offset from the first edge. In one embodiment, the signal pad is under and electrically connected to at least one of the signal pins along the entire distance of the at least one signal pin. In one configuration a first length is defined by a first length of the signal pad and the waveguide section, and the first wing and the second wing each comprise a first section and a second section. The first section is wider than the second section, the first section has a length equal to the first length, and the first section is closer to the first edge than the second section such that the second section extends from the first section in the direction of the second edge.

Also disclosed is an electrical interface on a circuit board for electrically connecting the circuit board to a connector. The electrical interface includes a signal conductor including a signal pad configured to connect to a connector pin. A waveguide section extends from the signal pad. The waveguide narrowing from a signal pad width to a microstrip conductor width. A microstrip conductor extends from the waveguide. The microstrip conductor has a width that is less than the signal pad width. Also part of this embodiment is a first ground section spaced rightward from the signal conductor. The first ground section has an inner edge and an outer edge, the inner edge angles in correspondence with the narrowing of the waveguide to generally track an outer right edge of the waveguide. A second ground section is spaced leftward from the signal conductor. The second ground section has an inner edge and an outer edge such that the inner edge angles in correspondence with the narrowing of the waveguide to generally track an outer left edge of the waveguide.

This embodiment may further include a plurality of vias in the first ground section and a plurality of vias in the second ground section. The vias are located along an outer edge of the first ground section and the second ground section and further including conductive material that electrically connects the first ground section and the second ground section to a ground plane located in the circuit board. The signal pad may extend under the entire length of the connector pin. It is contemplated that one or more capacitors may connect to the microstrip conductor.

The first ground section and the second ground section may each include a base and a wing. The base has a width that is at least 1.5 times the width of the signal pad and a length that is generally the same as combined length of the signal pad and the waveguide section. The wing extends from the base and is parallel to the microstrip conductor such that each wing is aligned along the outer edge of each respective first and second ground section. One configuration may include an area of the circuit board between the first ground section and the signal pad and waveguide section which is removed and the area of the circuit board between the second ground section and the signal pad and waveguide section is removed.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

This drawback to prior art connector performance was identified by the inventors when using prior art methods and structures for connecting BNC connector to a printed circuit board. Such systems did not meet eye mask minimum requirements to operate at data rates above 6 Gbps. The inventors determined that failure to meet performance specification was due to a large impedance discontinuity from the connector to the PCB that produced large reflections back from the connector.

Figure 1:
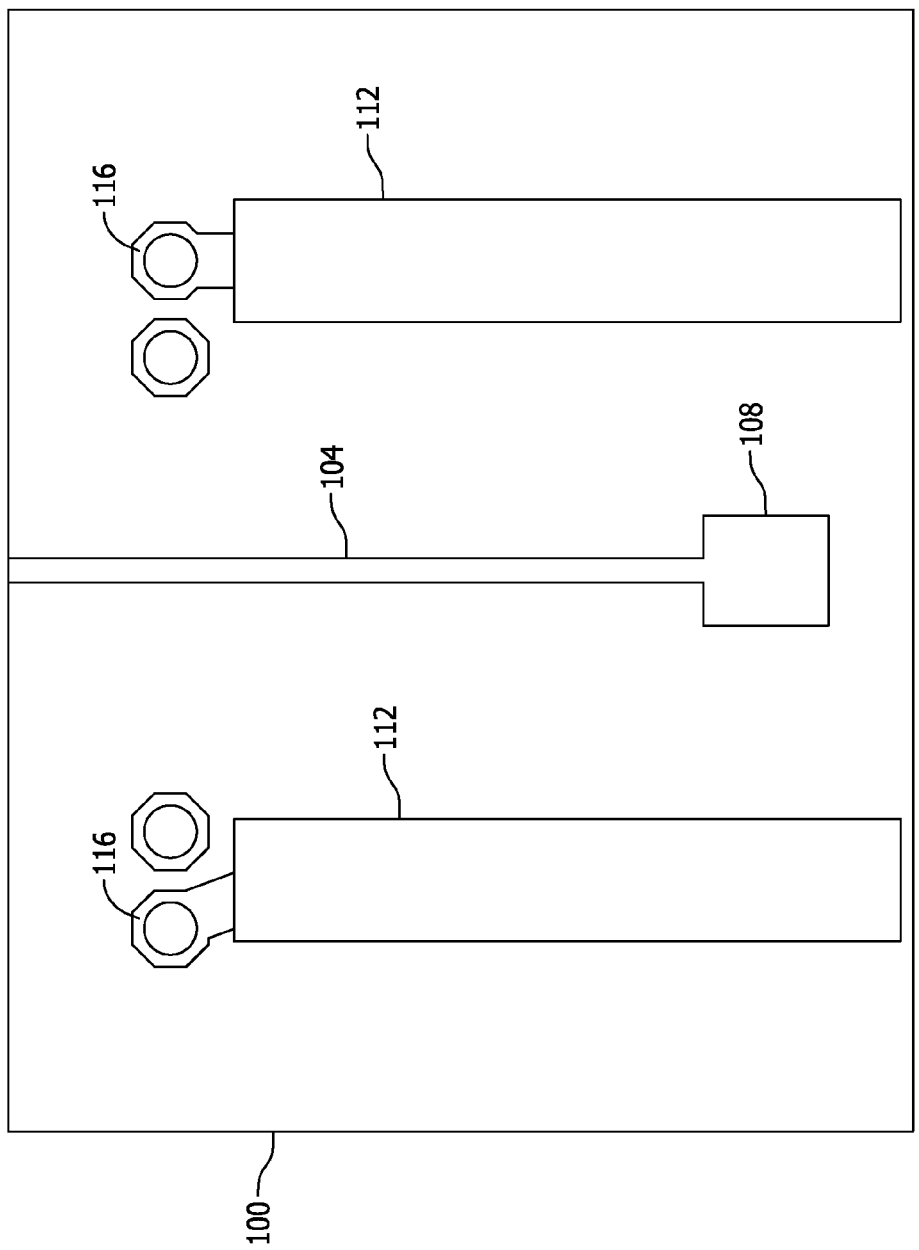
FIG. 1 is a prior art printed circuit board (PCB) layout for BNC type connector.

FIG. 1 illustrates a prior art board layout or a BNC connector. Although shown as a BNC type connector arrangement, numerous other types of connectors have similar board arrangements, from an impedance matching and return path behavior and which suffer from similar performance drawbacks. In this exemplary prior art configuration, a printed circuit board (PCB) 100 or other connector support structure is shown. Not shown in this embodiment is the structure to which the cable connector connects. On the PCB 100 are one or more conductive layers including a ground layer 112 which connects to a connector ground. One or more vias 116 connect the ground layer 112 to other ground layers or ground planes in the PCB 100.

A signal pad 108 is also provided to receive a signal from a cable conductor carrying the signal. A transmission line trace 104 extends from the signal pad 108.

A drawback to this prior art configuration, the configuration of this arrangement, as shown, is that it increases return loss, insertion loss, and it creates impedance mismatch. The prior art design shown in FIG. 1 lacks the numerous vias in the ground section (also known as the ground cage, shown on each side of the trace) that is proposed in the new interface design. As a result, in the prior art the loop inductance covers the entire distance of the ground section. By placing the vias in the ground pad or ground section there is less return loop inductance due to the shorter current path to ground. In addition, the prior art design utilizes a non-tapered transition (discussed below) between the trace and the signal section, to which the center pin of the connector mounts.

Another feature of the prior art which hindered option was the section of PCB between the signal pad (connected to the center trace) and the edge of the PCB. In the prior art, there was no conductor in this area and hence, the connector pin that carries the signal is floating over the PCB, without any signal section conductor under the pin. The signal pad in the prior art would only be under and contacting the tip of the connector pin. The new connector to PCB interface described below extends the signal pad conductor under the entire section of the connector center pin. The center pin may be electrically connected to this entire section and hence not floating. This provides a smoother transition for the signal as it passes from the connector to the signal pad.

To overcome the drawbacks of the prior art a connector to PCB interface is proposed which establish a smooth 75 ohm transition to reduce or eliminate reflections and discontinuities. This proposed configuration allows operation up to and in excess of 12 Gbps data rate, and in other embodiments, operation at or above 25 Gbps. Using this new approach of BNC footprint or interface establishes a smooth 75 ohm transition from the connector to the PCB.

Disclosed is a Bayonnet Neill-Cocelman (BNC) footprint on a PCB that is designed to have a smooth 75 ohm characteristic impedance transition from a BNC connector to a printed circuit board (PCB) that may be utilized in any frequency band, including but not limited to 3 Gbps, 6 Gbps, 12 Gbps, and 25 Gbps applications to enable technologies such as 4K Ultra High Definition TV (UHDTV). In other embodiments, the interface may be configured for connectors other than a BNC type connector and for other operating data rates or frequency bands.

In a video broadcast environment, the signal travels from a first position at a transmitter along a 75 ohm PCB transmission line to a BNC connector at a second position. One end of the 75 ohm coaxial cable attaches at the second position. At the other end of the cable, connection is made at another BNC connector, defined as a third position. Finally, another 75 ohm PCB transmission line carries the signal to the receiver at a fourth position. In this system topology, we can see that the primary performance impediment would occur at the BNC connector interface, the second and third position, from PCB to cable and cable to PCB.

Although the interface is discussed herein as a connector for an incoming signal, the interface may be configured for a transmitter or an outgoing connector interface, or a bidirectional interface.

Figure 2:
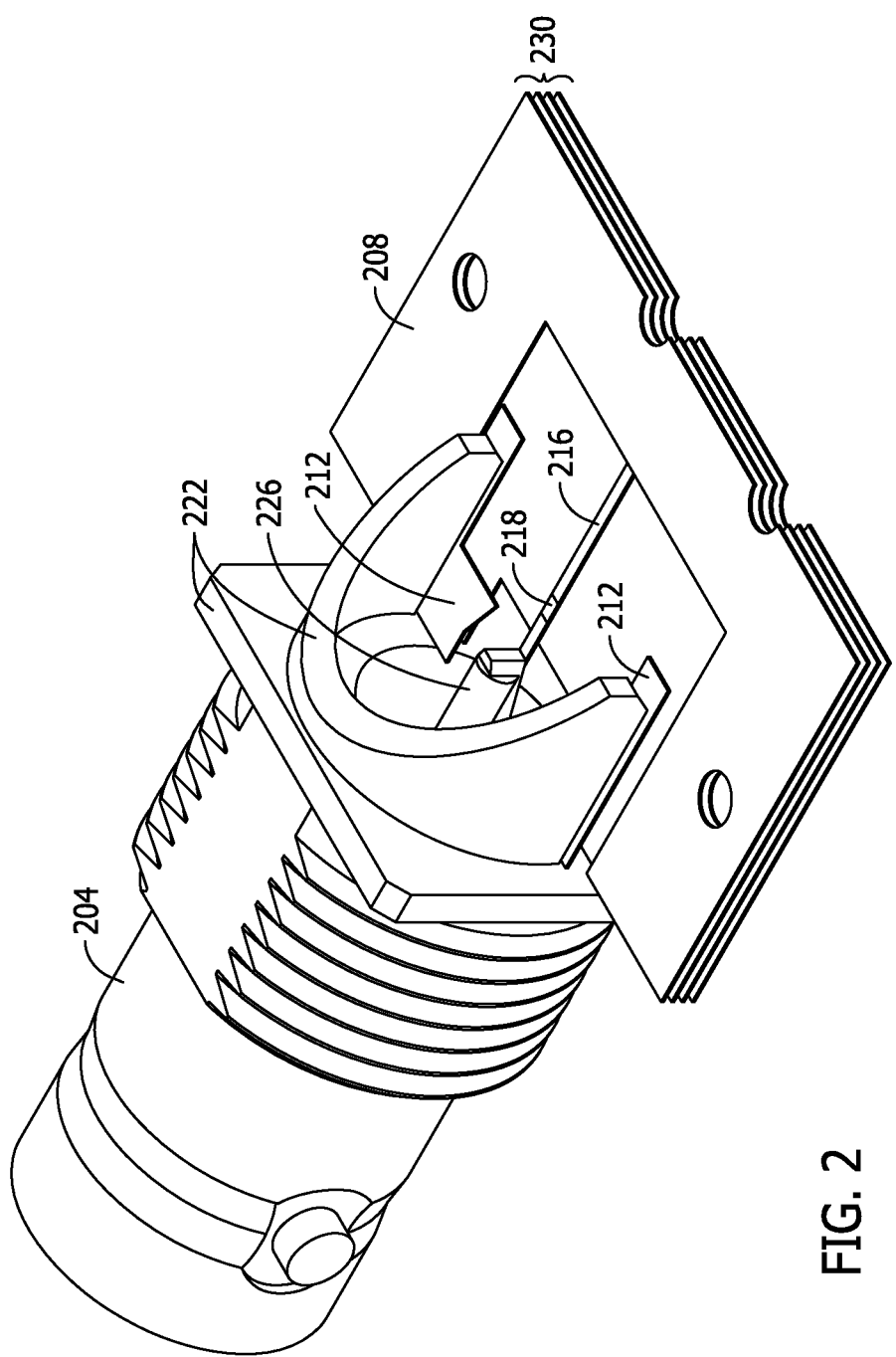
FIG. 2 illustrates a perspective view of an example environment of operation, namely a BNC connector and PCB interface.

FIG. 2 illustrates a perspective view of an example environment of operation, namely a BNC connector and PCB interface. As shown, the connector 204 mounts to the printed circuit board (PCB) 208 formed of multiple layers 230. The connector 204 includes a ground portion 222 and a connector pin 226, which conducts the signal. The ground section 212 connects to the grounded portion of the connector 204 while a signal trace 216 on the PCB 208 connects to a signal conductor (often referred to as the signal or center pin) of the connector. The trace connects at the center of the signal pad and leads to downstream integrated circuits. The trace impedance is 75 ohms. One or more capacitors 218 may be placed along the signal trace 216. The capacitors serve as AC coupling elements or DC blocks. The example embodiment shown and described herein utilizes a 75 ohm trace and interface. In other embodiments, different impedances may be matched using the same principles as described herein. Although shown as a BNC connector, it is contemplated that any type connector as it interfaces with the PCB will benefit from the innovation disclosed herein.

There are many varieties of BNC connectors having different PCB mating characteristics and all such variations are covered by this innovation. To focus the scope of the discussion we will focus primarily on the edge-launch variety as shown in FIG. 2. These basically straddle the PCB card itself and make signal contact along the same axis as the PCB transmission line. Ground contacts are made on either side of the signal contact. The structure can be considered or described as a co-planar referenced microstrip line. Therefore, on one side of the mating interface is coaxial mode signal propagation along the cable and within the connector and on the other side is a co-planar microstrip mode signal propagation. However, whenever a mode transition occurs along a transmission line, discontinuities are created and form equivalent electrical parasitic reactance. These manifest as resonances or stop bands in the frequency response which can in turn cause severe loss and distortion.

Thus, there is a need to make the BNC mating interface as electrically seamless as possible. Since modification of the connector itself is not possible due to legacy issues, it is the PCB footprint that is modified to best transfer the signal's frequency spectrum as transparently as possible. This is accomplished by modifying the physical structures and connections of both the signal and the ground to facilitate the optimum mode conversion. In the frequency domain, this amounts to minimizing insertion and return losses over the signal passband.

Figure 3:
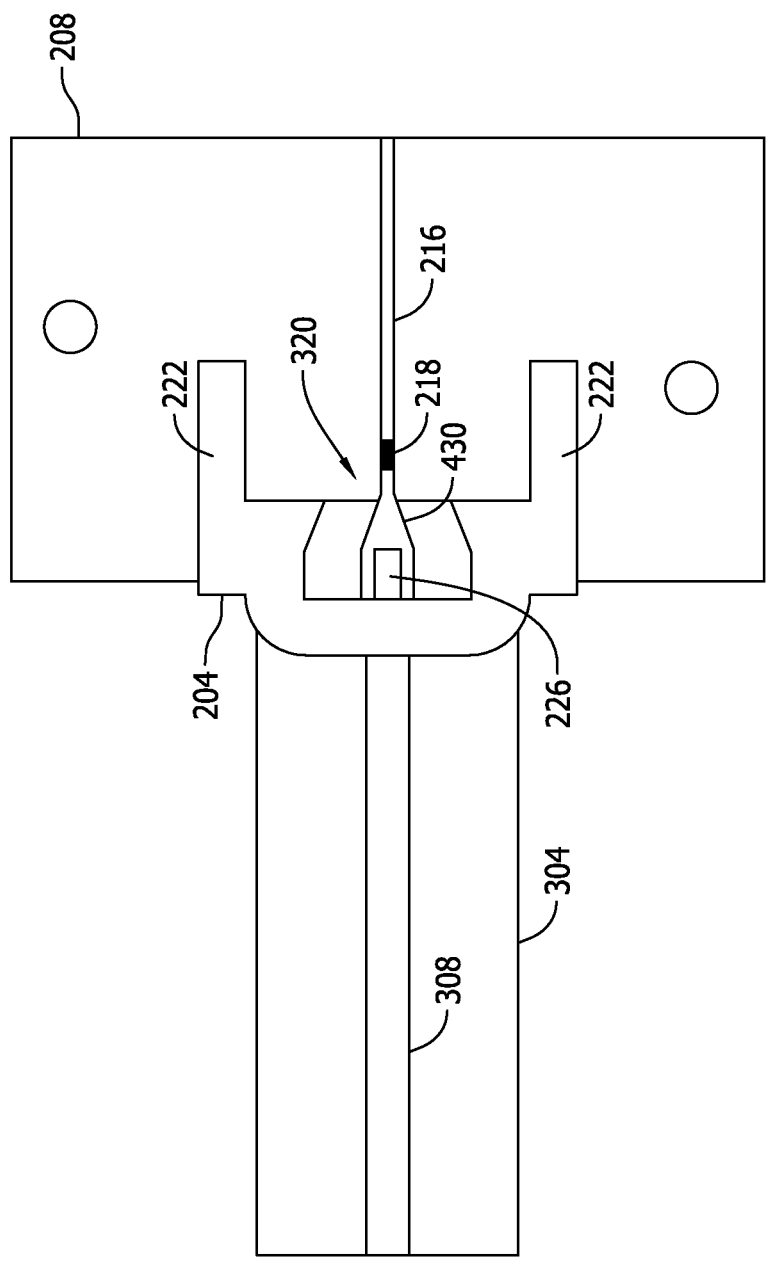
FIG. 3 illustrates a top overhead view of a simplified connector and PBC interface.

FIG. 3 illustrates a top overhead view of a simplified connector and PCB interface. As compared to FIG. 2, similar elements are identified with identical reference numbers. As shown, a cable 304 (also known as a channel) includes a signal conductor 308. The cable 304 terminates with a portion of the connector (not shown) that in turn connects to the connector portion 204 that is mounted to the PCB. The connector portion 204 includes a grounded portion 222 and the signal pin 226. The interface 320 between the connector 204 and the PCB 208 is discussed below in greater detail. The trace 216 is a conductive layer that extends from where the connector pin 226 connects to the signal pad (not shown in FIG. 3) on the PCB 208. The optional series capacitor 218 may be established in the trace 216 is also shown.

Figure 4A:
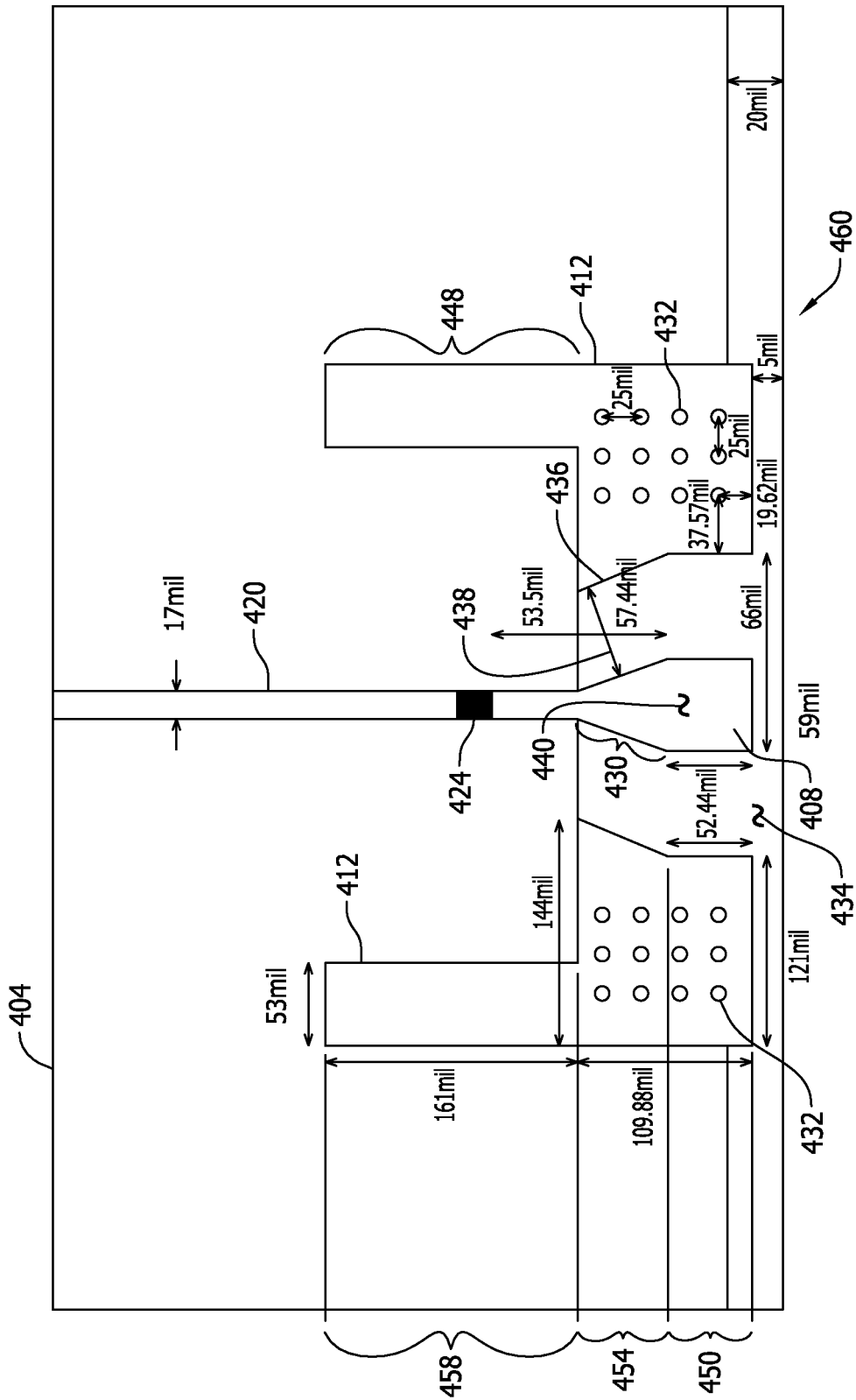
FIG. 4A illustrates an exemplary PCB conductor layout for the ground path and signal path.

FIG. 4A illustrates an exemplary PCB conductor layout for the ground path and signal path. Not shown in this example embodiment is the portion of the connector that attaches to the PCB. Therefore what is shown is what is often referred to as the connector footprint. This is but one possible example embodiment. Other connectors that could be used include HDBNC or HDMI, or any other connector. For example, although the footprint shown and described is in the context of a BNC connector, other interfaces utilizing similar principles could be established for other connector shapes. For example, HDBNC may require different scaling.

It is thus contemplated that one of ordinary skill in the art will arrive at different configurations which vary from this example layout, but which provide benefits over the prior art and which do not depart from the claims that follow. Thus, the widths, lengths, and thickness of each portion may be changed, the angles or taper may be changed, and the number and locations of vias may be changed.

As shown, the PCB 404, which is formed from multiple insulating and conductive layers, supports the conductive areas on the PCB which are described below. In general, provided are ground pads 412, which are electrically connected to a ground node of the PCB 404. The ground pads may include one or more vias 432. The vias electrically connect the ground pads 412 to one or more ground layers of the PCB 404.

Also shown is a signal pad 408, which receives the signal from the connector. The cable and connector are not shown in this figure. The signal pad 408 connects to a signal trace 420. The center pin of the connector (not shown) may rest on and solder connect to the signal pad 408. The signal pad 408 includes a generally rectangular or wider base which tapers downward to a narrower section 430 that has a final width that is generally identical to the width of the trace 420.

In series with the signal trace 420 is an optional capacitor 424. For purposes of discussion, the signal path on the PCB consists of two sections, the first one based on a coplanar waveguide section 430 and the second based on a microstrip trace 420 both with a characteristic impedance of 75 ohms.

The connector interface of the PCB 404 may be separated into three sections to aid in understanding and discussion. These sections of areas are shown as a first section 458, a second section 454, and a third section 450.

The first and second sections 450 and 454 illustrate a smooth transition from the landing pad 408 for landing the connector pin of the BNC (not shown) by using a coplanar waveguide section 430 designed at 75 ohms. A clearance 434 on the ground plane reduces excess of capacitance and the excess of inductance by separating the signal pad 408 and the ground pads 412 by an amount to create a uniform impedance of 75 ohms.

This section also has numerous vias 432 connecting top ground pad 412 and the bottom ground planes (not shown) for each side of the coplanar wave ground planes in order to reduce the signal return path to thereby maintain this section at 75 ohms. The numerous vias provide a benefit over prior art designs which utilize just one or two vias located away from the footprint edge of the PCB 404 and away from the signal pad 408. The via locations in the sections 450 and 454 coupled with numerous vias 432 reduces impedance mismatch and insertion loss at the connector to PCB interface by forcing signal return current in the ground path to be immediately adjacent to the signal pad 408 such that return path excess inductance is minimized. This reduces loop inductance. In one embodiment the vias are located along the edge of the ground pad that oppose the signal path. The outer sections of the connector connect to the ground pad 412 on the PCB 404.

A second section 454 illustrates a smooth and impedance controlled transition from a 75 ohm coplanar waveguide 430 to a microstrip 75 ohm line by using a tapered line 430 (triangular-like shape) that transitions at a sloping angle to the width of the signal trace 420. This angle of taper is variable based on geometry of the connector and connector pin, impedance match, PCB thickness and material, and trace width.

The angle(s) are specifically defined in degrees herein since these are calculated based on the PCB layer stack, material, microstrip line width, connector pin length, and required spacing of the signal path conductors to the ground path conductors.

In one configuration the angle is based on the pin size and width such that the end of the connector pin is about one-half way down the taper of the microstrip. If the taper is to steep, it will create discontinuity and the actual taper angle may be determined during testing and based on the pin size and location on the board. The edge 436 of the ground pads 412 which opposes the tapering waveguide section 430 also tapers in association with the tapering waveguide section 430 as shown.

In one embodiment, signal pad is same width as trace width which results in no tapering of the section defined as the microstrip line.

A further aspect of the second section is that the edge of the ground pad, which opposes the tapering coplanar waveguide, also tapers to track or correspond to the slope or angle of the coplanar waveguide. This establishes a uniform distance 438 between the coplanar waveguide 430 and the opposing ground pad 412. Maintaining the coplanar wave guide at the same distance 438 relative to the tapered ground pad 412 maintains a characteristic impedance of 75 ohms.

A third section 458 illustrates a microstrip line 420 of 75 ohms which may optionally include a series capacitor 424. The capacitor 424 may be located at any location in the microstrip line 420 but in one embodiment, it is located in the microstrip line 420 immediately after the coplanar waveguide 430. Also part of the third section 458 are ground pad wings 448 which extend inward from the connector edge 460 of the PCB 404. The ground pad wings 448 extend the contact area of the grounded portion of the connector. The ground pad wings also function to provide locations for placement of ground vias 432 in order to minimize ground path excess inductance.

Also shown in FIG. 4A are exemplary measurements for an example embodiment of a PCB interface for a 75 ohm interface to a BNC connector. These figures are exemplary only and other configurations will cause one or more values to change. For example, different connectors or impedances may result in a change in dimensions, and the dimensions may change even for a 75 ohm interface to a BNC connector.

Figure 4B:
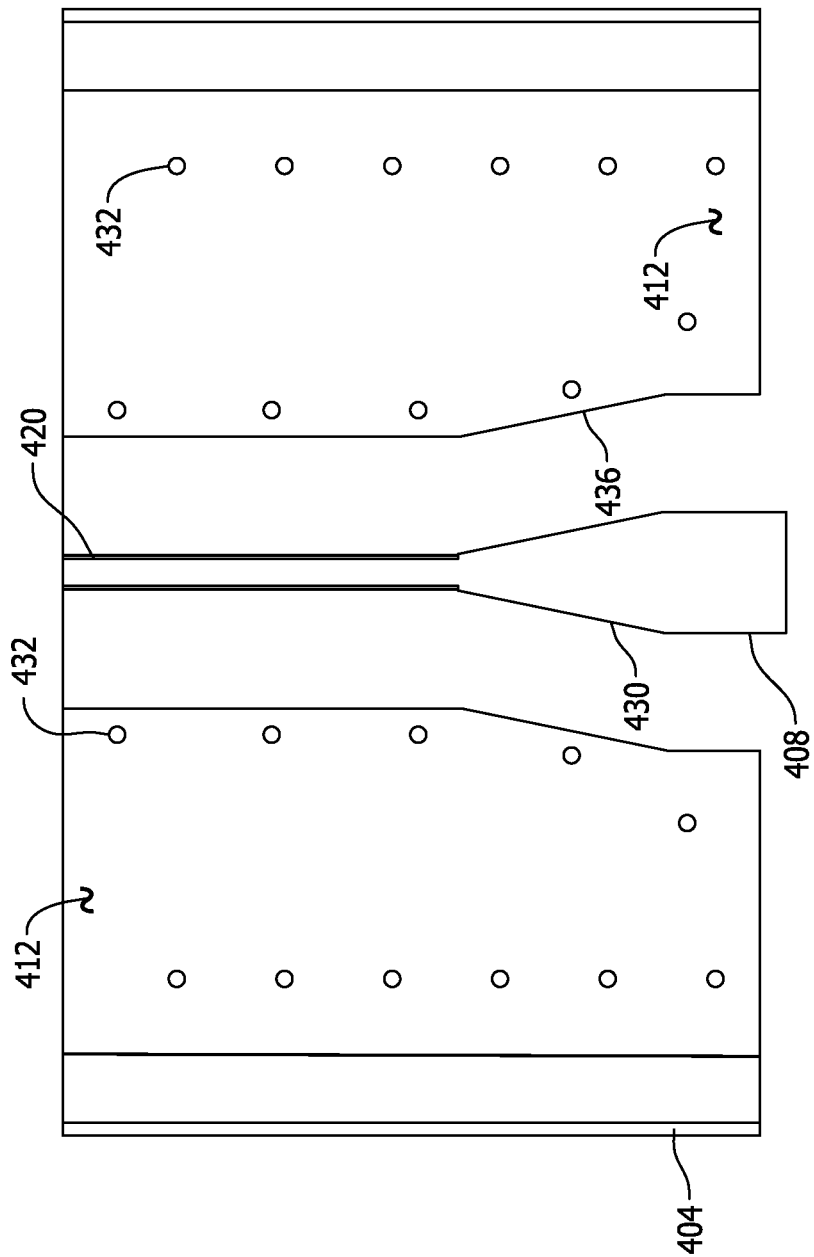
FIG. 4B illustrates an alternative embodiment of a PCB conductor layout for the ground path and signal path.

FIG. 4B illustrates an alternative embodiment of a PCB conductor layout for the ground path and signal path. As compared to FIG. 4A, identical or similar elements are identified with identical reference numbers. The PCB 404 includes ground pad 412 on each side of the signal pad 408, tapering waveguide section 430, and signal trace 420, which form the signal path. In this example embodiment, the tapering of the waveguide section 430 is at a different angle. The edge 436 of the ground pads 412 which opposes the tapering waveguide section 430 also tapers in association with the tapering waveguide section 430 as shown.

In this embodiment, the vias 432 are placed along the outer and inner edges of the ground pad 412 as shown. The location of the vias in this embodiment provides the advantage of minimizing the excess ground path inductance by means of the inner edge placed vias closest to the signal path, and for the outer edge vias, eliminating the possibility of second-order resonances caused by the ground pad 412 if it is not uniformly and well connected to the other ground layers of PCB 404.

Figure 5:
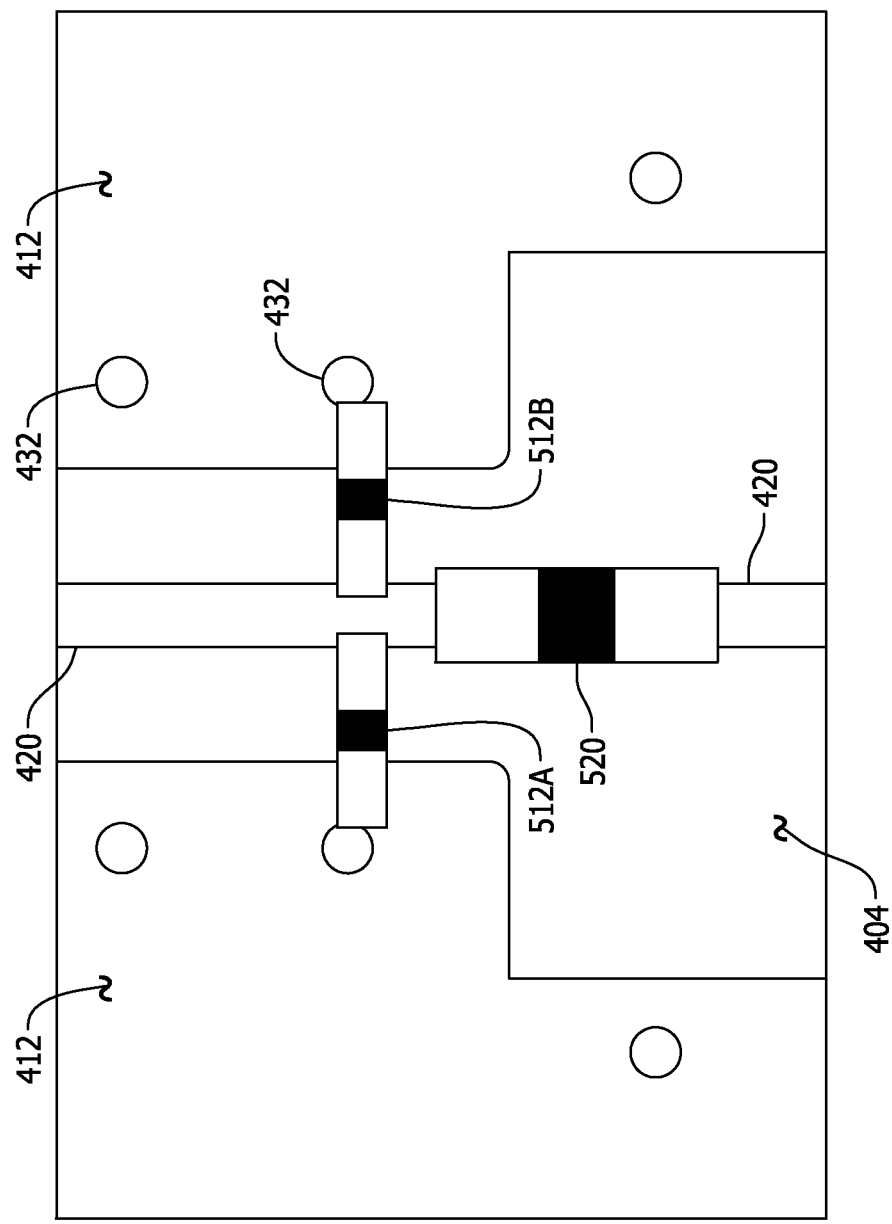
FIG. 5 illustrates an example embodiment with symmetrically coupled resistors associated with the signal trace.

FIG. 5 illustrates an example embodiment with symmetrically coupled resistors associated with the signal trace. As compared to FIG. 4A, identical or similar elements are identified with identical reference numbers. The ground pad 412 is shown in relation to the signal trace 420, both of which are on the PCB 404. The PCB 404 supports the ground pad 412 and the signal trace 420. Vias 432 are shown as described above.

In this embodiment, a resistor 520 is located in line or in series with the signal trace 420. Although shown as a single resistor 520, multiple resistors may replace the single resistor. In one embodiment, the resistor 520 is located close to the tapered end of the waveguide (not shown in this embodiment). In one embodiment the resistor 520 is within 10 mils of distance to the end of the tapered end of the waveguide. In one embodiment the resistor 520 is within 30 mils of distance to the end of the tapered end of the waveguide. In one embodiment the resistor 520 is within 50 mils of distance to the end of the tapered end of the waveguide. In one embodiment the resistor 520 is within 70 mils of distance to the end of the tapered end of the waveguide. The resistor 520 in conjunction with resistors 512A and 512B to form a resistive matching network which is sometimes referred to as a minimum loss pad or matching network, which is a resistive matching network comprised of resistors. In this embodiment, the loss pad is part of the signal path to optimize impedance matching of a 75 ohm connector interface to a 50 ohm connector interface. In other embodiments, the matching optimization may be for other resistive/ impedance values. This resistive network may be in addition to or in the place of the capacitor 424 shown in FIG. 4A.

Also shown in FIG. 5 are resistors 512A, 512B. The resistors 512A, 512B have a first terminal connected to the signal trace 420 and a second terminal connected to a ground pad 412. In this example embodiment, the resistors 512A, 512B are symmetric, such that resistor 512A has the same resistance value as resistor 512B, and is located directly opposite each other along the signal trace 420. The location and configuration thus establishes the resistor 512A symmetric to resistor 512B. The symmetric resistors 512A, 512B provide the benefit of reducing parasitic inductance to ground by 50% due to their equivalent circuit use as equal parallel elements. Although only two resistors 512A and 512B are shown, it is contemplated that any number and symmetric configuration of resistors may yield improved results consistent with the scope and intent of this invention. Multiple loss pads can be in signal path.

The resistive network formed by resistors 512A, 512B, 520 both shunts to ground and passes energy along the signal path 420 to set the attenuation ratio. The values of the resistors are selected to achieve and optimize impedance matching with consideration to the interface which connects to the connector. In this embodiment, the resistors 512A, 512B are both the same size and value and located at the same point along the trace 420. The arrangement of the resistors reduces parasitic inductance and through the use of small components, also reduces parasitic capacitance.

Figure 6:
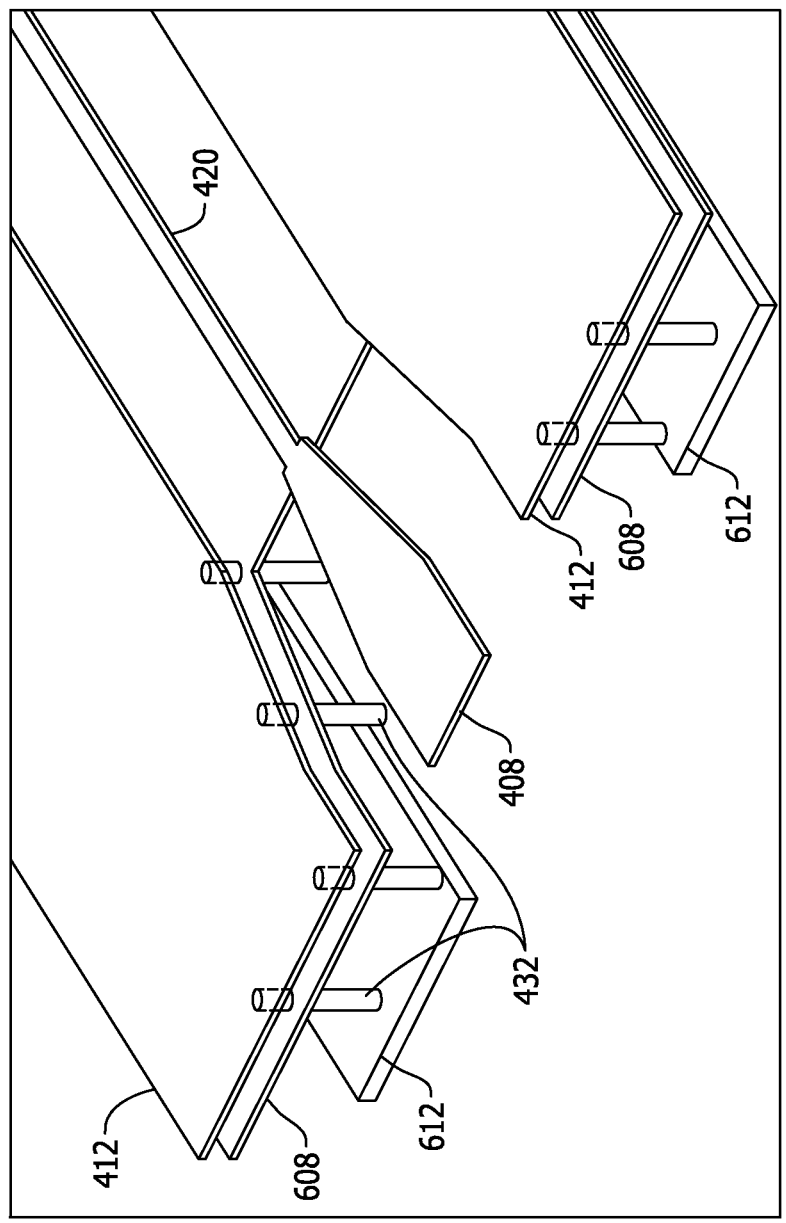
FIG. 6 illustrates a perspective view of the ground layers with interconnecting vias within the PCB.

FIG. 6 illustrates a perspective view of the ground layers with interconnecting vias of the PCB. As compared to FIG. 4B, identical or similar elements are identified with identical reference numbers. As shown on a top layer of the PCB is the signal path 420 and the ground layer 412. The upper ground layer 412 is on each side of the signal path 420. In this arrangement, below at least a portion of the upper ground layer 412 is a second ground layer 608. Multiple vias 432 electrically connect the upper ground layer 412 to the second ground layer 608. One or more additional ground layers 612 may be located below the upper ground layer 412 and the second ground layer 608. The additional ground layers 612 (such as a bottom ground layer) may likewise electrically connect to the other ground layers by the multiple vias 432. One or more insulating layers or other conductive paths may be located between the ground layers. For example, one of ordinary skill in the art understands that a PCB is formed from multiple layers, including insulating layers and conductive layers. Also contemplated are power or VCC layers which supply voltage to one or more devices located on the PCB. It is contemplated that some embodiments may only have one ground layer while other embodiments may have additional ground layers.

Figure 7:
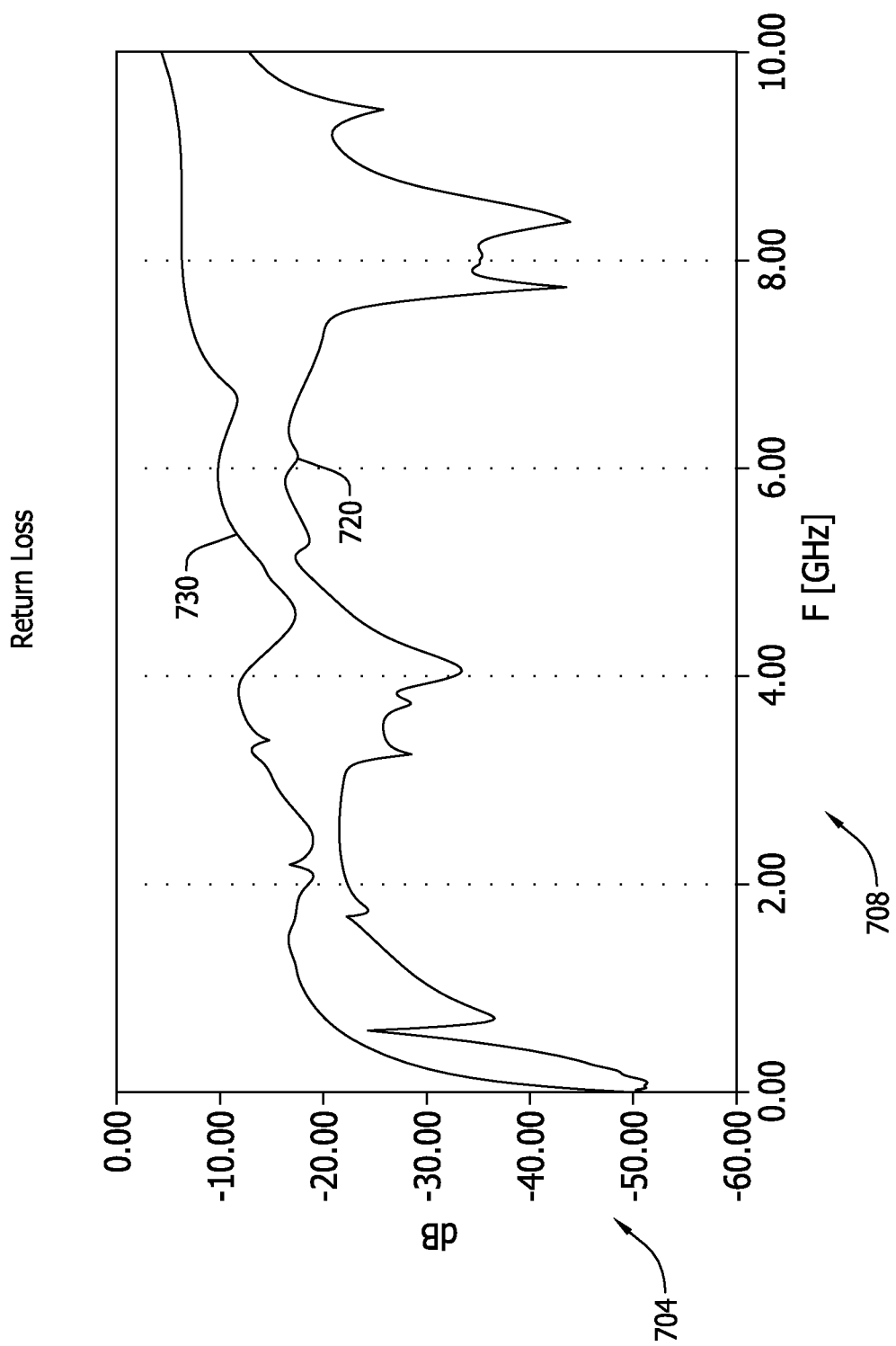
FIG. 7 illustrates a plot of the reflected signal magnitude in relation to frequency for a signal applied to a prior art interface and the improved interfaced.

FIG. 7 illustrates a plot of reflected signal magnitude in relation to frequency for a signal applied to a prior art interface and the improved interface. This is an exemplary plot and various factors will determine signal behavior. These plots are generated during actual testing of the improved interface. As shown, the vertical axis 704 represents signal magnitude, or signal loss, in dB range. The horizontal axis represents frequency, in gigahertz. This plot graphically shows the return loss at different frequencies. A first signal plot 730 is representative of the prior art PCB to connector interface. As can be seen, at frequencies over 7 GHz, the signal 730 suffers from significant reflection magnitude loss and results in an inability to operate at these frequencies.

A second signal plot 720 is representative of the improved PCB to connector interface. As can be seen, at frequencies over 7 GHz up to and including 10 GHZ, the signal 720 does not suffer significant reflection magnitude loss which results in an ability to operate at these frequencies.

Figure 8A:
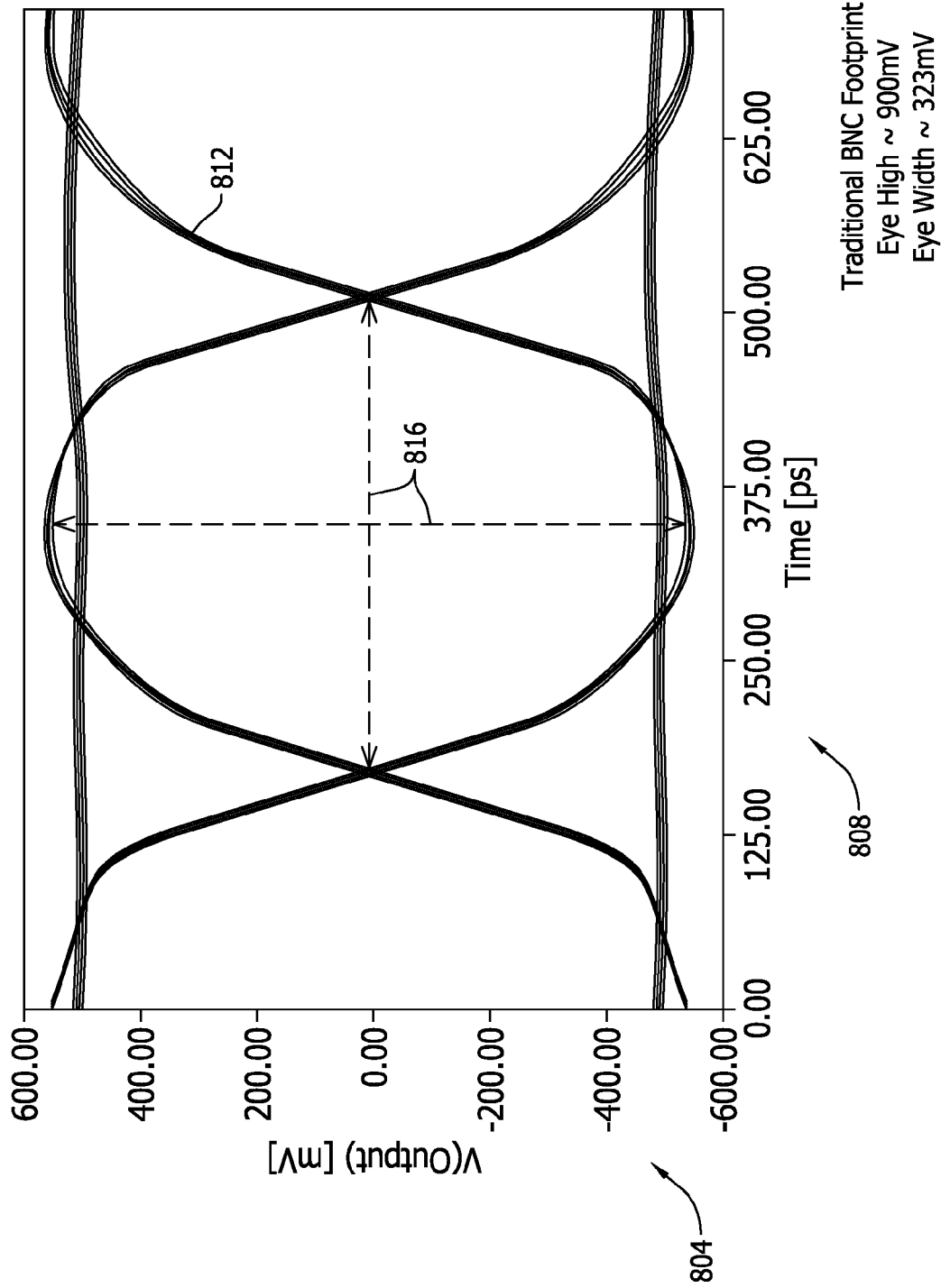
FIGS. 8A and 8B illustrate plots of example signal eye diagrams for a 3 Gbps signal received through a prior art interface and the improved interface.
Figure 8B:
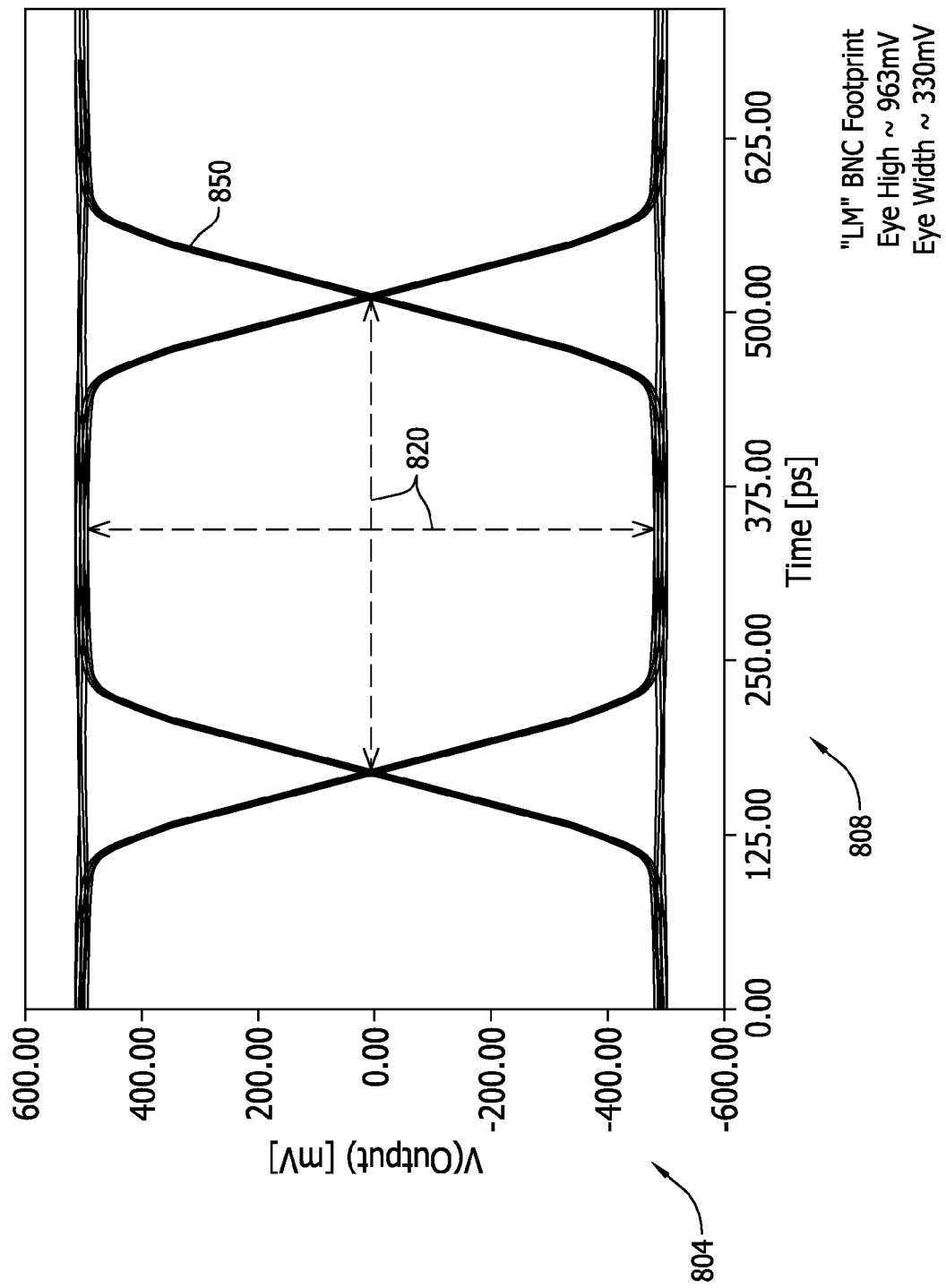

FIGS. 8A and 8B illustrate plots of example signal eye diagrams for a 3 Gbps signal received through a prior art interface and the improved interface. The signal plots in FIGS. 8A and 8B represent the signal after it passes through the channel, connectors, and the signal pads. These plots are exemplary only, but are generated during actual testing of the improved interface. As shown in FIG. 8A, the vertical axis 804 represents voltage, in millivolts while the horizontal axis 808 represents time. A signal plot generated with the prior art interface is shown. As can be seen, the height and width 816 of the eye formed by the signal plot 812 is generally open and results in a received signal that will yield an acceptable bit error rate subject to further processing.

Likewise, as shown in FIG. 8B, the vertical axis 904 represents voltage, in millivolts while the horizontal axis 808 represents time. A signal plot 850 generated with the improved interface is shown. As can be seen, the height and width 820 of the eye formed by the signal 850 is generally open but also shows an improvement over the height and width 820 in the prior art embodiment. The signal path is tighter with less overshoot. The variation in slope of the received signal is also improved over the prior art interface test results of FIG. 8A. The improvement at 3 Gbps is significant.

Thus, the improved interface operates better than the prior art interface at 3 Gbps, although the prior art solution yielded acceptable results.

Figure 9A:
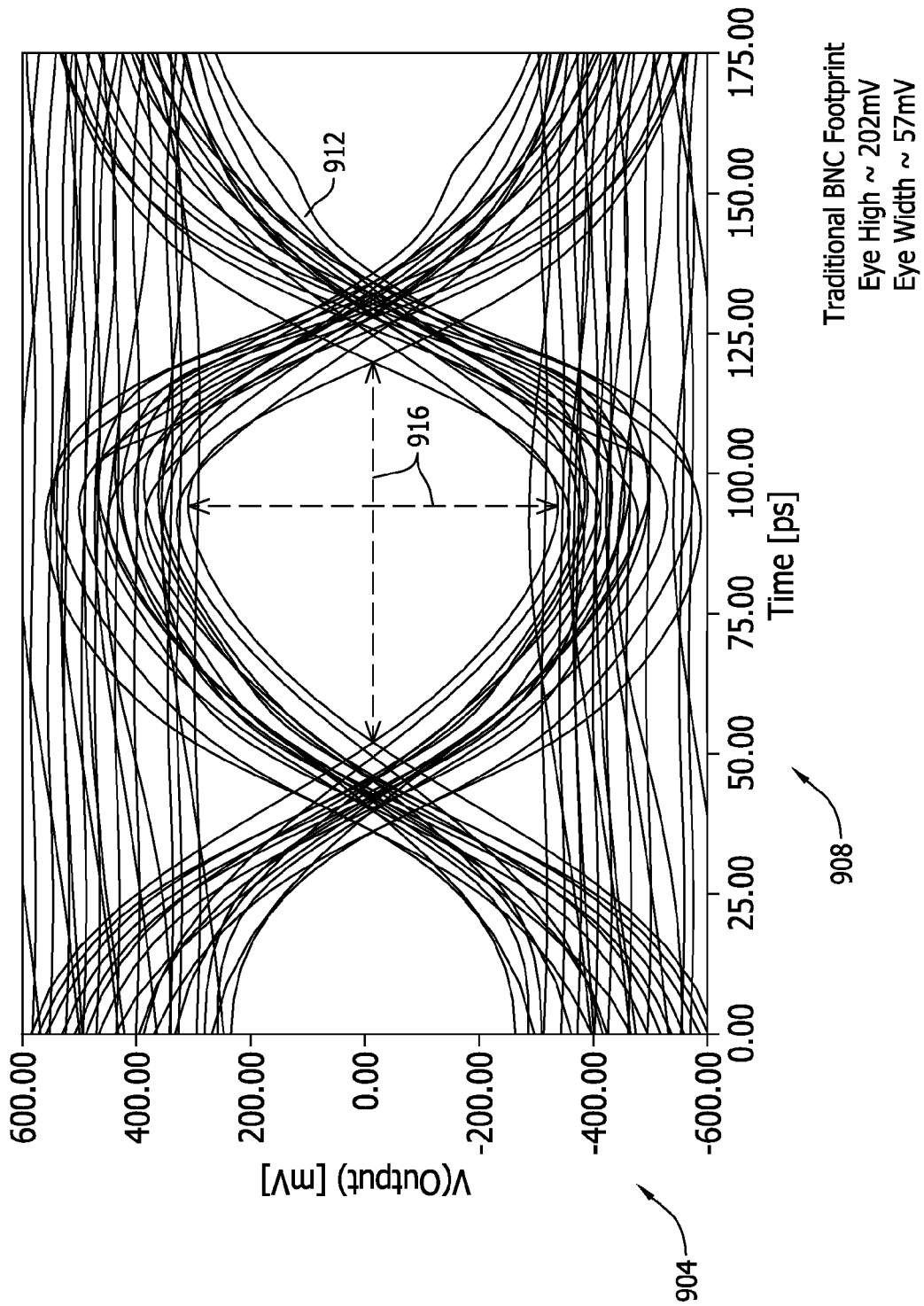
FIGS. 9A and 9B illustrate plots of example signal eye diagrams for a 12 Gbps signal received through a prior art interface and the improved interface.
Figure 9B:
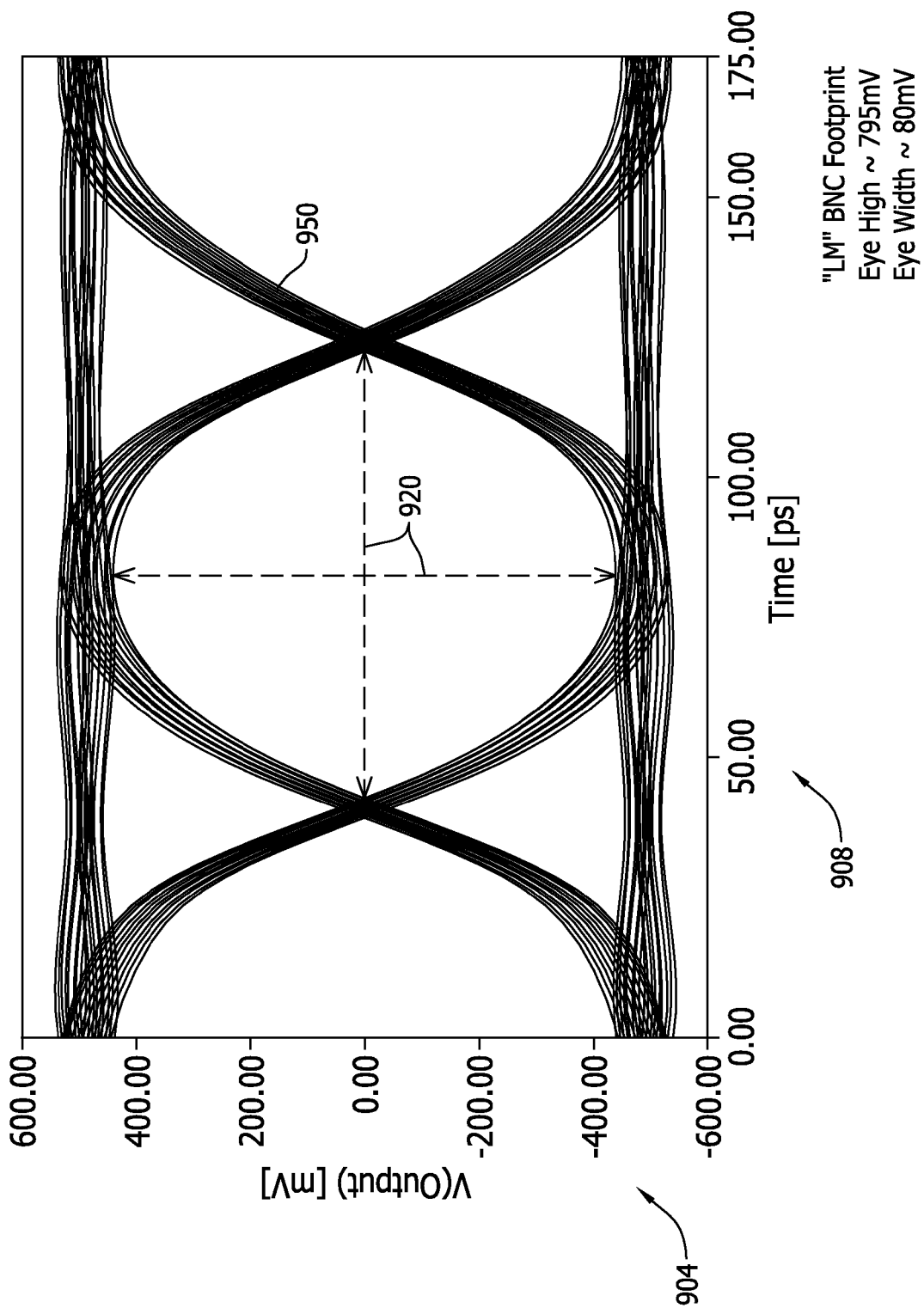

FIGS. 9A and 9B illustrate a plots of example signal eye diagrams for a 12 Gbps signal received through a prior art interface and the improved interfaced. The signal plots in FIGS. 9A and 9B are after the channel, connectors, and the ground pad and signal pads shown in FIG. 4A. These plots are exemplary only, but are generated during actual testing of the improved interface. In FIG. 9A, the vertical axis 904 represents voltage, in millivolts while the horizontal axis 908 represents time. A signal plot generated with the prior art interface is shown. As can be seen, the height and width 916 of the eye formed by the signal plot 912 is narrow and not well defined. Numerous signal plots encroach on the center area of the signal plot that forms the eye. This results in a received signal that is unsuitable for its intended purpose and will yield an unacceptable bit error rate.

In FIG. 9B, the vertical axis 904 represents voltage, in millivolts, while the horizontal axis 908 represents time. A signal plot 950 generated with the improved interface is shown. As can be seen, the height and width 920 of the eye formed by the signal 950 is significantly more open and improved over the signal plot shown in FIG. 9A. The eye is more open and also shows an improvement in the height and width 920 as compared to the signal resulting from the prior art interface. In this signal, the eye height (EH) for the 12 Gbps signal increased from 202 mV to 795 mV. This is a significant improvement. The signal path also exhibits less overshoot. The variation in slope of the received signal is also greatly improved over the prior art interface test results of FIG. 9A. Thus, the improved interface operates better than the prior art interface at 12 Gbps, and would allow subsequent processing to achieve bit error rate which meet specification.

Other Design Considerations and Advantages

In addition to the benefit described above, the improved interface design has additional benefits and optional variations. In one embodiment, the distance from the edge of the board to conductive layers is 20 mils. Hence, the conductive layers of the printed circuit board are set back 20 mils from the edge of the PCB. However, in other embodiments, other distances may be established to provide the desired reduction of excess inductance and capacitance and therefore optimal impedance matching. The capacitance is formed by signal pad to lower ground layers. To reduce this capacitance a void (cut out) is created in the ground layer. The size of the cut out or void may vary. The board is still present to support the signal pad and support the connector.

In one embodiment the dielectric material used in the PCB is FR4, but in other embodiments other dielectrics may be used. As will be appreciated, different dielectrics may change the inductance, capacitance and coupling and as such one or more dimensions may be adjusted based on the resulting change the inductance, capacitance and coupling from a particular dielectric material.

As discussed above in the primary embodiment, the coplanar waveguide (CPW) section of the interface (ground section or ground pads) was designed to preserve a 75 ohm characteristic impedance. In other embodiments or for other applications different resistance or impedance characteristics may be established. For example, in this embodiment after the CPW section, a microstrip trace precedes with a characteristic impedance of 75 ohm but in other embodiments different microstrip impedances may alter the impedance and configuration of the interface. In this embodiment, the interrelation (size and transition) of the CPW and the microstrip sections denotes a smaller impedance variation, since this transition was meticulously designed to have 75 ohms.

The present design has several advantages over previous solutions. One advantage is that the disclosed interface has a full set of vias on each coplanar waveguide ground section. This full set in connection with placing the vias in the positions shown provides advantages to maintain a characteristic impedance of 75 ohm across this section. In addition, this interface design reduces the loop length of the return path over the grounds. This translates to less impedance variation.

A further benefit is that the controlled transition from coplanar waveguide to the microstrip line avoids reflections caused due to an abrupt transition (in the prior art) and as a result the impedance response over the line is maintained closer to 75 ohm.

What is claimed is:

1. An interface including a Bayonet Neill-Concelman (BNC) connector and a printed circuit board (PCB) comprising:
   a BNC connector including a connector signal pin and an outer ground terminal on each side of the connector signal pin, the connector signal pin generally centered in relation to the ground terminal;
   a PCB having an edge configured to receive the BNC connector, the PCB having multiple layers, the layers forming all or only a portion of the entire area of the PCB, the PCB layers including:
      a first insulating support layer;
      a ground layer above the insulating support layer;
      a second insulating layer above the ground layer;
      a interface layer on the second insulating layer, the interface layer configured to electrically connect the PCB to the BNC connector, the interface layer including:
      a signal path comprising:
      a signal pad electrically connected to the connector signal pin, the signal pad having a signal pad width;
      a waveguide section electrically connected to the signal pad, the waveguide section formed at a first end with the signal pad width and then tapering to a second end having a second width;
      microstrip trace electrically connected to the tapered second end of the waveguide section, the waveguide section having a width generally equal to the second width;
      a ground path electrically connected to the connector ground terminal, the ground path formed on each side of the signal path and including conductive vias that pass through the second insulating layer to electrically connect the ground path to the ground layer in the PCB.

2. The interface of claim 1, wherein the signal pad extends substantially under the entire distance that the connector signal pin extends onto the PCB.

3. The interface of claim 1, wherein the waveguide section is a coplanar waveguide.

4. The interface of claim 1, wherein the ground path has an inner edge that is spaced away from and opposing the edge of the signal pad and waveguide section by a constant distance to thereby correspond to the shape of the signal pad and waveguide section.

5. The interface of claim 4, wherein the ground path has a first wing and a second wing on that are on opposing sides of the microstrip trace and run parallel with the microstrip trace.

6. The interface of claim 1, further comprising a capacitor in series in the microstrip trace, the capacitor configured as an AC coupling capacitor or DC block.

7. The interface of claim 1, wherein the ground pad is spaced away from the edge of the PCB.

8. A circuit board, configured to electrically connect to a connector, comprising:
a connector including one or more connector ground terminals and one or more signal pins;
a circuit board having a first edge and an opposing second edge, the first edge configured to support the connector and electrically connect to the connector, the circuit board configured with an electrically conductive ground area and an electrically conductive signal area;
the signal area configured to include, from the first edge toward the second edge:
a signal pad electrically connected to at least one of the connector signal pins, the signal pad having a first width;
a waveguide section extending from the signal pad, the waveguide section narrowing in width from the first width to a second width;
microstrip trace, having a second width, extending from the waveguide section that is at the second width;
a ground area electrically connected to at least one of the connector ground terminals, the ground area including a first wing to the right of the signal area and a second wing to the left of the signal area, both of the first wing and second wing having first edge that opposes the signal area and which correspondences in profile to an edge of the signal area and having a second edge opposing the first edge, such that the first edge has first row of vias located parallel to the first edge and the second edge has a second row of vias located parallel to the second edge, the vias electrically connecting the ground area to a lower ground area.

9. The circuit board of claim 8, further comprising one or more vias on the right wing of the ground area and one or more vias on the left wing of the ground area, the vias formed of conductive material to electrically connect the ground area to a ground layer in the circuit board.

10. The circuit board of claim 8, further comprising a capacitor in series with the microstrip trace.

11. The circuit board of claim 8, further including as part of the circuit board:
a first insulating support layer;
a ground layer above the insulating support layer;
a second insulating layer above the ground layer, the second insulating layer supporting the signal area and the ground area.

12. The circuit board of claim 8, wherein the ground area is offset from the first edge.

13. The circuit board of claim 8, wherein the signal pad is under and electrically connected to at least one of the signal pins along substantially the entire distance of the at least one signal pin.

14. The circuit board of claim 8, wherein a first length is defined by a first length of the signal pad and the waveguide section, and the first wing and the second wing each comprise a first section and a second section, the first section wider than the second section, the first section having a length equal to the first length, and the first section closer to the first edge than the second section such that the second section extends from the first section in the direction of the second edge.

15. An electrical interface on a circuit board for electrically connecting the circuit board to a connector, the electrical interface comprising
a signal conductor including:
a signal pad configured to connect to a connector pin;
a waveguide section extending from the signal pad, the waveguide narrowing from a signal pad width to a microstrip conductor width;
a microstrip conductor having a microstrip conductor length extending from the waveguide, the microstrip conductor width less than the signal pad width;
a first ground section spaced rightward from the signal conductor, the first ground section having an inner edge and an outer edge, the inner edge angling in correspondence with the narrowing of the waveguide to generally track an outer right edge of the waveguide and extending parallel with the microstrip conductor for at least a portion of the microstrip conductor length such that a distance between the first ground section and an opposing section of the microstrip conductor is equal to or greater than a distance between the first ground section and the waveguide section; and
a second ground section spaced leftward from the signal conductor, the second ground section having an inner edge and an outer edge, the inner edge angling in correspondence with the narrowing of the waveguide to generally track an outer left edge of the waveguide and extending parallel with the microstrip conductor for at least a portion of the microstrip conductor length such that a distance between the second ground section and an opposing section of the microstrip conductor is equal to or greater than a distance between the second ground section and the waveguide section.

16. The interface of claim 15, further comprising a plurality of vias in the first ground section and a plurality of vias in the second ground section, the vias located along an outer edge of the first ground section and the second ground section and further including conductive material that electrically connects the first ground section and the second ground section to a ground plane located in the circuit board.

17. The interface of claim 15, wherein the signal pad extends under an entire length of the connector pin.

18. The interface of claim 15, further comprising one or more capacitors connected to the microstrip conductor, a resistive network as part of the microstrip conductor, or both.

19. The interface of claim 15, wherein the first ground section and the second ground section each comprise a base and a wing, the base having a width that is at least 1.5 times the width of the signal pad and a length that is generally the same as a length of the signal pad and the waveguide section, and the wing extends from the base and is parallel to the microstrip conductor, each wing aligned along the outer edge of each respective first and second ground section.

20. The interface of claim 15, wherein an area of the circuit board between first ground section and the signal pad and waveguide section is removed and the area of the circuit board between second ground section and the signal pad and waveguide section is removed.

21. The interface of claim 15, further including a symmetric resistive network in the microstrip trace.

* * * * *